United States Patent [19]

Miller et al.

[11] 4,331,873

[45] May 25, 1982

[54] PHOTOCAPACITIVE IMAGE CONVERTER

[76] Inventors: Robert A. Frosch, Administrator of the National Aeronautics and Space Administration, with respect to an invention of William E. Miller, Hampton, Va.; Arden Sher, Belmont; Yuan H. Tsuo, Freemont, both of Calif.

[21] Appl. No.: 161,256

[22] Filed: Jun. 20, 1980

[51] Int. Cl.³ .......................... H01J 31/49; G01T 1/22
[52] U.S. Cl. ..................................... 250/330; 250/370
[58] Field of Search ............... 250/330, 332, 338, 370, 250/371; 357/30

[56] References Cited

U.S. PATENT DOCUMENTS

| | | | |
|---|---|---|---|
| 3,919,555 | 11/1975 | Singer | 250/332 |
| 4,142,206 | 2/1979 | Ennulat | 250/330 |
| 4,250,384 | 2/1981 | Pulvari | 250/330 |

*Primary Examiner*—Alfred E. Smith
*Assistant Examiner*—Janice A. Howell
*Attorney, Agent, or Firm*—William H. King; John R. Manning; Howard J. Osborn

[57] ABSTRACT

Apparatus for converting a radiant energy image into corresponding electrical signals including an image converter. The image converter includes a substrate 20 of semiconductor material, an insulating layer 23 on the front surface of the substrate and an electrical contact 22 on the back surface of the substrate. A first series of parallel transparent conductive stripes 25 is on the insulating layer with a processing circuit 33 connected to each of the conductive stripes for detecting the modulated voltages generated thereon. In a first embodiment of the invention (FIG. 5), a modulated light stripe 38 perpendicular to the conductive stripes 25 scans the image converter. The resulting modulated signals generated on the conductive stripes are detected by the processing circuits 40 to produce signals that represent the image focused on the image converter. In a second embodiment of the invention (FIG. 1) a second insulating layer 28 is deposited over the conductive stripes and a second series of parallel transparent conductive stripes 29 perpendicular to the first series is on the second insulating layer. A different frequency current signal $f_n$ is applied to each of the second series of conductive stripes 29 and a modulated image is applied to the image converter (FIG. 4). The resulting signals detected by the processing circuits 33 represent the image.

6 Claims, 6 Drawing Figures

PHOTOCAPACITIVE IMAGE CONVERTER

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; USC 2457).

BACKGROUND OF THE INVENTION

The present invention relates generally to the conversion of radiant energy into electrical signals, and more specifically to a photocapacitive MIS (metal-insulator-semiconductor) image converter.

In the field of image conversion, there are several devices currently in use. The vidicon is possibly the most widely used of these devices. It utilizes an electron beam to scan a photoconductive target which is the light sensor. A transparent conductive layer applied to the front side of the photoconductor serves as the signal electrode. The signal electrode is operated at a positive voltage with respect to the back side of the photoconductor which operates at near zero voltage as the cathode. In operation, a scanning beam initially charges the back side of the target to cathode potential. When a light pattern (image) is focused on the photoconductor, its conductivity increases in the illuminated areas and the back side of the target charges to more positive values. The scanning electron beam then reads the signal by depositing electrons on the positive charge areas providing a capacitively coupled signal output at the signal electrode. The vidicon is only moderately sensitive and response speed is comparatively slow.

The image orthicon utilizes a photocathode as the light sensor. The photoelectron image pattern developed at the photocathode is focused by an axial magnetic field producing one spiral loop onto a thin moderately insulating target surface. When the photoelectrons from the photocathode strike the target secondary emission occurs causing the establishment of net positive charges on the target. The electron beam scans the charged target pattern, deposits electrons on the more positively charged areas, and the modulated beam returns to an electron multiplier surrounding the electron gun. The output signal is the amplified anode current of the electron multiplier. The image orthicon has high sensitivity and can handle a wide range of light levels and contrasts, but is an intricate device and has high noise problems in the dark areas of the image.

The image isocon is a variant of the image orthicon which utilizes a more sophisticated electron-optic system to produce a higher signal-to-noise ratio than the orthicon, overcoming the beam-noise problem. The device, however, is relatively complex, expensive, and fragile.

The SIT (silicon intensifier target) and the SEC (secondary electron conduction) image converters employ a photocathode as the image sensor; the photoelectrons given off are focused onto a special target which provides high gain. In a SIT converter the target is a thin silicon wafer upon which a tightly spaced matrix of p-n junction diodes is formed. When the photoelectrons impinge onto the target, they cause multiple disassociations of the electron-hole pairs. The holes are collected at the p-side of the diode where the charge is neutralized by the scanning electron beam and the signal is read out on the backplate of the target. The SEC converter uses a thin layer of semiporous KCl which provides gain by internal secondary electron emission and the signal is also read out from the backplate of the target. These systems, like the others mentioned, require scanning electron beams and have their associated disadvantages.

The image dissector employs a photocathode light sensitive surface. The electrons given off are focused onto an image plane. A set of deflection coils provide fields which sweep the entire electron image across an aperture positioned near the center of the image plane. An electron multiplier acts on only those electrons passing through the aperture. The output signal is taken from the electron multiplier. This device, though of extremely high speed, has very low efficiency.

Charged coupled devices or photoresistive devices are solid-state systems requiring no scanning beam. Electron-hole pairs are created when light impinges on the p-type silicon imaging area. The charges, representing picture element signals, are stored in potential wells under depletion biased electrodes. The charges are transferred by applying a positive pulse to adjacent electrodes which are at right angles to the p-type channel stops. The whole image is thus transferred to a storage raster. Each horizontal line is then read out from the storage raster in sequence to provide the output signal. These devices, though fairly simple, are only moderately fast and not as sensitive as required for certain applications.

The purpose of the present invention is to provide a simple, low cost image converter having high sensitivity and speed, based on photocapacitive principles using low carrier concentration semiconductors and coherent detection, high capacitance insulators.

Therefore, it is an object of this invention to provide a solid state, photocapacitive image converter with high speed and sensitivity.

Another object of this invention is to provide an image converter that is simple and inexpensive to construct.

A further object of this invention is to provide an image converter which can be constructed so as to operate in a wide range of radiant energy wavelengths and magnitudes including infrared and low light as well as full sunlight and artificial light.

Yet another object of this invention is to provide an image converter which can be used in the presence of high magnetic fields.

Still another object of this invention is to provide an imaging device utilizing thermal capacitive principals.

A still further object of this invention is to provide a device that operates at room temperature and without an external biasing voltage.

Other objects and advantages of this invention will become apparent to those skilled in the art hereinafter in the specification and drawings.

SUMMARY OF THE INVENTION

The invention consists essentially of an n-type or p-type semiconductor wafer such as Si, GaAs, or Ge onto the back of which an ohmic contact is applied. A thin transparent insulating layer of either lanthanum fluoride ($LaF_3$), or a native oxide semiconductor, or both covers the front surface of the wafer. $N_s$ transparent conducting stripes, hereinafter designated "signal strips," are deposited parallel to each other on the insulating layer. Another thin insulating layer similar to the first is applied over the signal stripes. Finally a second set of $N_p$ transparent conducting stripes, hereinafter designated "pointer stripes," is deposited on the wafer's front surface parallel to each other and at right angles to the signal stripes.

The back ohmic contact is made of material chosen so that the semiconductor is in depletion with no applied bias, or the ohmic contact and the front transparent conducting stripes are made of materials whose workfunction difference biases the device into depletion or inversion without an external biasing voltage. The image to be converted is focused onto the front surface of the wafer and is modulated by a chopper at frequency $f_i$ before it reaches the surface of the device. The modulated light of the image will cause the thickness of the depletion layer in the semiconductor to be modulated producing a signal voltage on the signal stripe at the image modulation frequency $f_i$ and proportional to the average intensity of the image over that stripe. The pointer stripes are used to identify the contribution to the signal from the intensity at a given spot on the signal stripe. This is accomplished by connecting each of the pointer stripes to a different current generator such that the frequency of each stripe is distinct and identifiable. Thus, for a pointer stripe with frequency $f_n$ the signals in a given stripe will include components at frequencies $f_i \pm f_n$ with amplitudes that are proportional to the intensity of the image at the intersection of that signal stripe and that pointer stripe. By attaching each signal stripe to a processing circuit that measures the amplitude of the Fourier component of the signal at frequencies $f_i \pm f_n$, the image pattern incident at the junction of each pointer stripe and each signal stripe can be determined. The information from an effective $N_s \times N_p$ array can thereby be determined simultaneously while making only $N_s + N_p$ contacts to the device.

In a second embodiment of the invention a modulated stripe of light perpendicular to the signal stripes scans the converter. This modulated stripe of light scan takes the place of the pointer stripes and current generators in the first embodiment and therefore are omitted.

DETAILED DESCRIPTION OF THE INVENTION

Figure 1:
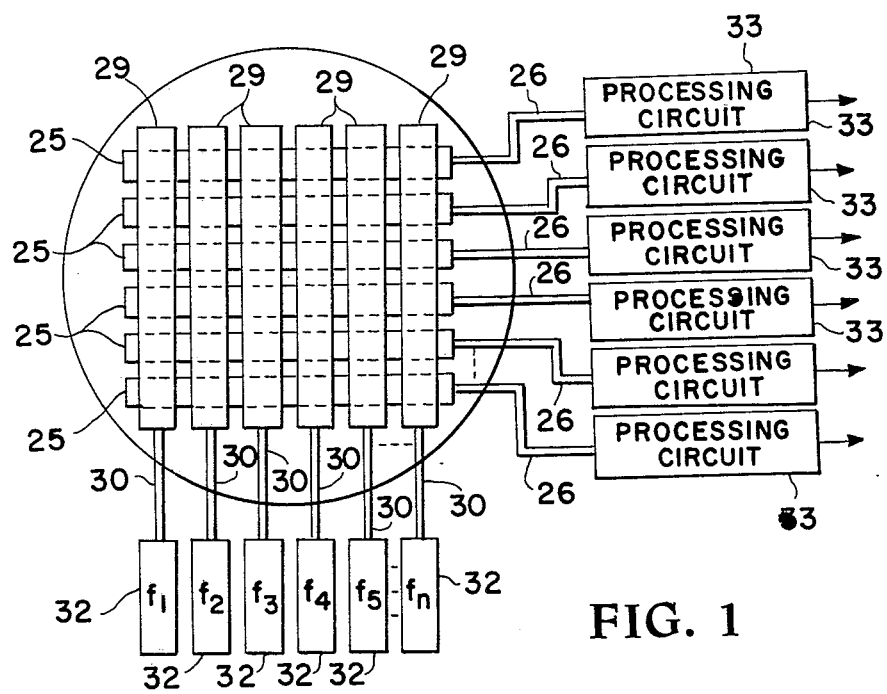
FIG. 1 is a top view of the preferred embodiment of the invention.
Figure 2:
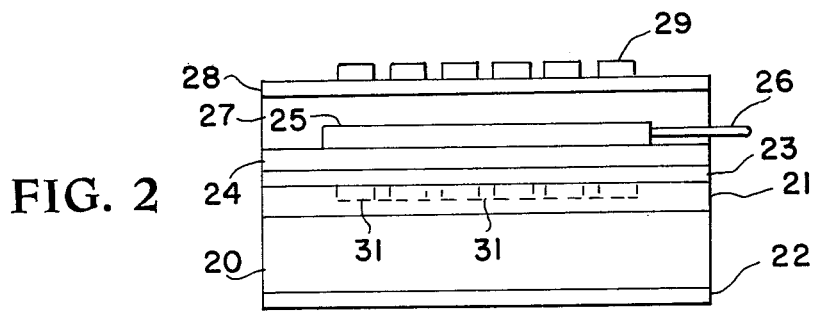
FIG. 2 is a front view of the preferred embodiment of the invention.
Figure 3:
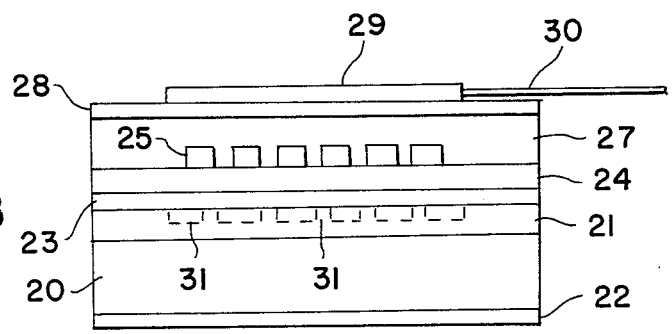
FIG. 3 is a side view of the preferred embodiment of the invention.

The primary embodiment of the invention is illustrated in FIGS. 1, 2, and 3. This primary embodiment is a MIS (metal-insulator-semiconductor) photocapacitive structure which consists essentially of a substrate 20 of n-type bulk silicon semiconductor crystal with a carrier concentration of approximately $1 \times 10^{18}$ cm$^3$ and a 2 to 50$\mu$ epitaxial layer 21 of semi-intrinsic, low-doped, low carrier concentration silicon having an ideal carrier concentration on the order of $1 \times 10^{13}$ cm$^3$ grown on the front surface of substrate 20. An ohmic contact 22 of Al is e-beam deposited on the back surface of the semiconductor substrate 20, and sintered in flowing N$_2$ gas. A 250 Å thick transparent insulating layer 23 of SiO$_2$ is grown on the front surface of silicon layer 21, and a second 250 Å transparent insulating layer 24 of LaF$_3$ is deposited directly on top of the SiO$_2$ layer 23. A series of parallel, transparent, conductive stripes 25, hereinafter referred to as signal stripes, is deposited on LaF$_3$ layer 24. Each of the signal stripes 25 has a small gap between itself and the next closest signal stripe on either side, and has an output contact 26. A second double-insulating layer consisting of a 250 Å layer 27 of SiO$_2$, and a 250 Å layer 28 of LaF$_3$, identical to layers 23 and 24 is deposited over the signal stripes 25.

A series of parallel, transparent, conductive stripes 29, hereinafter referred to as pointer stripes, is deposited on the surface of LaF$_3$ layer 28 and perpendicular to the signal stripes 25. The pointer stripes have gaps between each other the same as those described for the signal stripes and each pointer stripe has an input contact 30. Finally, to complete the MIS photocapacitive image converter chip structure, an N+ region 31 is ion-implanted in the epitaxial silicon semiconductor layer 21 in the gaps between the signal stripes and the pointer stripes forming a grid of channel stops. This channel stop grid prevents cross talk and improves resolution by cutting the gap required between stripes to less than 1$\mu$, and thus allowing a larger number of stripes per unit area to be placed on the chip surface. The entire MIS chip is sealed in an appropriate component package having a transparent window over the front surface of the chip to allow the passage of light, and the package is pressurized with an inert gas to prevent fogging and corrosion.

The pointer stripe input contacts 30 are each connected to a different current generator 32, each of which has a discrete and identifiable frequency ($f_1$, $f_2$, $f_3$, . . . $f_n$) such that harmonics of all other pointer stripe generators do not interfere. The current generators 32 are of high impedance in order to avoid shorting the signal generated by the modulated image, and the voltages are chosen to be relatively large, in the range of 1 to 100 millivolts, in order to reach the nonlinear mixing regime of the signal and pointer stripe voltages in the photocapacitor chip.

The signal stripe output contacts 26 are each connected to a processing circuit 33 which measures the amplitude of the Fourier component of the output signal at the sum of the current generator and image modulation frequencies. In this way, the image pattern incident on each junction of a signal stripe and a pointer stripe can be determined, and its position identified so as to allow transmission and reconstruction of the image.

Figure 4:
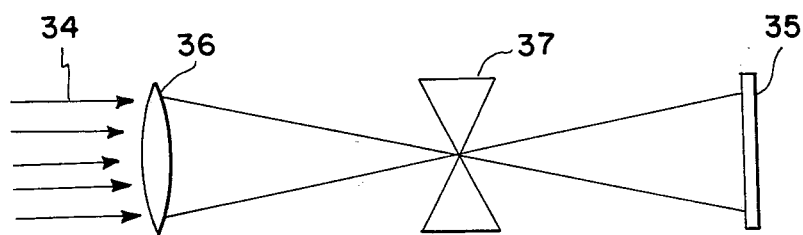
FIG. 4 is a schematic diagram illustrating the principal of operation of the preferred embodiment of the invention.

The operation of the image converter can be understood by referring to FIG. 4. The light image 34 from the object desired to be transmitted is focused onto the front surface of the image converter 35 of the invention by a focusing lens or series of lenses 36. A light chopper 37 is used to modulate the focused light falling on the image converter at some frequency $f_i$ in the range of 10 Hz to 5000 Hz. The greater the frequency of modulation, the quicker the response time, but as modulation frequency rises signal amplitude decreases making 5000 Hz the upper limit for obtaining usable signal-to-noise ratio.

When the light from light chopper 37 is focused on the embodiment of the invention shown in FIG. 1, a voltage is generated on the top signal stripe 25 that has a frequency $f_i+f_1$ and that has an amplitude proportional to the light intensity at the intersection of the top signal stripe 25 and the left most pointer stripe 29. Also voltages are generated on the top signal stripe 25 that have frequencies $f_i+f_2$, $f_i+f_3$, $f_i+f_4$, ... $f_i+f_n$ and that have amplitudes proportional to the light intensities at the intersections of the top signal stripe 25 and the corresponding pointer stripes 29. Likewise, voltages are generated on all of the signal stripes, corresponding to the light intensities at the intersections of the signal stripes 25 and pointer stripes 29.

The processing circuit 33 connected to each of the signal stripes 25 measures the amplitude of the Fourier component of the signals at frequencies $f_i+f_1$, $f_i+f_2$, ... $f_i+f_n$ whereby the image pattern along each signal stripe can be determined. In this way, the information from an $N_s \times N_p$ array can be determined simultaneously while making only $N_s+N_p$ contacts to the device.

Figure 5:
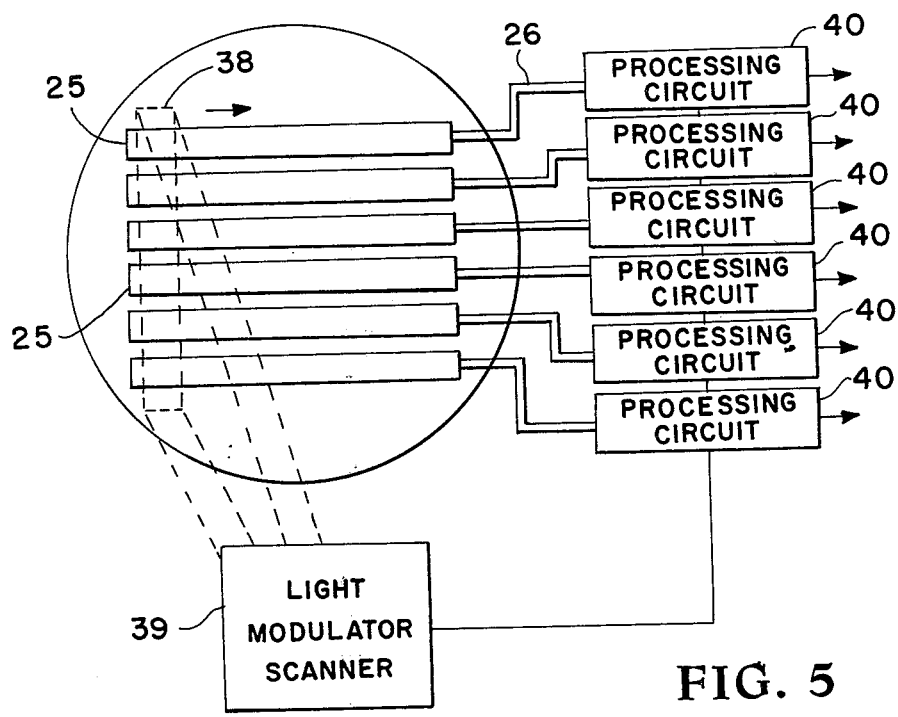
FIG. 5 is a top view of a second preferred embodiment of the invention.
Figure 6:
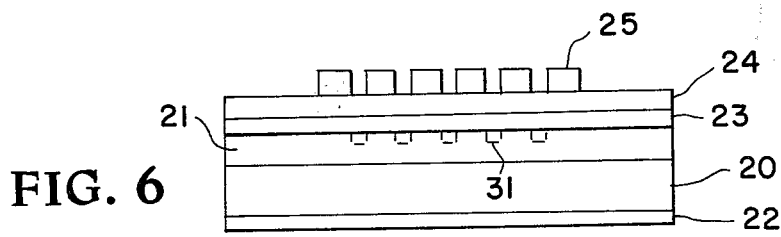
FIG. 6 is a side view of the embodiment of the invention shown in FIG. 5.

In a second embodiment of the invention shown in FIG. 5 the image converter is the same as the one shown in FIG. 2 except signal stripes 29, LaF$_3$ layer 28 and SiO$_2$ layer 27 are omitted. That is, as shown in FIG. 6 the image converter includes a silicon substrate 20, a back contact 22, a silicon layer 21, an insulating layer 23 of SiO$_2$, a layer 24 of LaF$_3$, an N$^+$ region 31 and signal stripes 25 with contacts 26 thereon. A stripe of modulated light 38 at wavelength near the peak response of Si ($\neq 0.82$ μm) is focused onto the image converter by means of a light modulator scanner 39. Stripe 38 is perpendicular to signal stripes 25 and is scanned from left to right across the image converter. A processing circuit 40 is connected to each of the signal stripes for detecting the modulated signals produced on the signal stripe. A timing signal is applied to the processing circuits 40 from the light modulated scanner to determine the positions on the signal stripes at which the modulated signals are produced.

In the operation of this embodiment of the invention an image of the scene being viewed is focused on the front surface of the image converter. The contact material is chosen so the semiconductor is in depletion with no bias applied. In regions where the light from the scene is brighter the depletion layer is thinned more than in darker regions. The stripe of modulated light 38 is focused on and scanned across the surface of the image converter. A modulated voltage is generated by a photocapacitive effect. The entire scene can be read by sweeping the modulated stripe 38 across the surface of the image converter. Each processing circuit 40 detects the modulated voltage and hence produces signals representing the scene along its corresponding signal stripe 25. The minimum width of the stripes is chosen so that cross talk between them is unimportant. That condition will be satisfied if the separation between stripes is larger than the depletion layer thickness, typically a few microns.

The advantages of this invention are that it provides an image converter that is highly sensitive, that operates at high speed, that is operable over a wide range of radiant energy frequencies and magnitudes, that is operable in the presence of high magnetic fields and that operates at room temperature without an external biasing voltage.

It is to be understood that the forms of the invention herewith shown and described is to be taken as preferred embodiments. Various changes may be made in these preferred embodiments without departing from the spirit or scope of the invention as defined in the subjoined claims. For example, in the embodiment of FIG. 1, if a simpler (but slower) image converter is wanted, a single pointer frequency $f_p$ can be used sequentially connecting one current generator to each pointer stripe. Then the information on the signal stripes will all be at frequency $f_i+f_p$. If a still less involved (and even slower) device is wanted, then a single detector circuit tuned at frequency $f_i+f_n$ can be used by also sequentially connecting it to each signal stripe. In the embodiment in FIG. 5, a simpler image converter can be made by completely covering the front surface with a transparent electrode instead of having a stripe pattern. Then instead of the modulated radiation being a stripe, it could be a small spot. This spot could then traverse the area of the device to read out the image. This device is not as sensitive nor as fast as the one in FIG. 5, but it is simpler since it is only a two terminal device.

What is claimed as new and desired to be secured by Letters Patent of the United States is:

1. An apparatus for converting a radiant energy image into corresponding electrical signals comprising:
   an image converter responsive to the radiant energy spectrum of the image desired to be converted;
   said image converter comprising a substrate layer of semiconductor material, an insulating layer deposited on the front surface of said substrate layer, an electrical contact layer on the back surface of said substrate layer, a series of parallel transparent conductive stripes on said insulating layer with an output contact on an end of each of said stripes;
   means for focusing said image to be converted onto said image converter;
   means for modulating the voltages created on said conductive stripes along parallel straight lines perpendicular to said conductive stripes; and
   means connected to each of said output contacts for detecting electrical signals corresponding to the light intensity along the corresponding conductive stripe.

2. Apparatus according to claim 1 wherein said means for modulating the voltages created on said conductive stripes along parallel straight lines perpendicular to said conductive stripes comprises:
   a second insulating layer deposited over the said series of parallel transparent conductive stripes, a second series of parallel conductive stripes on said second insulating layer perpendicular to the first series of conductive stripes, and current generator means for applying a different discrete frequency to each conductive stripe in said second series of conductive stripes.

3. Apparatus according to claim 2 wherein said means for focusing said image onto said image converter includes means for modulating the image at a frequency different from said different discrete frequencies.

4. Apparatus according to claim 3 wherein said means for detecting electrical signals corresponding to the light intensity along a corresponding conductive stripe includes a means for detecting only a combination of the image frequency and the corresponding conductive stripe frequencies.

5. Apparatus according to claim 1 wherein said means for modulating the voltages created on said conductive stripes along parallel straight lines perpendicular to said conductive stripes comprises:

means for focusing a light stripe on said image converter such that the light stripe is perpendicular to and crosses all of said conductive stripes, means for modulating said light stripe and means for scanning said light stripe through the length of said conductive stripes.

6. An image converter that can be used with a modulating scheme in which the electrical signals representating an entire image can be produced at the same time consisting of:

a substrate layer of semiconductor material;

an insulating layer deposited on the front surface of said substrate layer;

an electrical contact layer on the back surface of said substrate layer;

a series of parallel transparent conductive stripes on said insulating layer;

an electrical output contact on an end of each of said conductive stripes;

a second insulating layer covering said conductive stripes;

a second series of parallel transparent conductive stripes on said second insulating layer perpendicular to the first series of conductive stripes; and an electrical contact on an end of each of said second series of conductive stripes for receiving a modulating signal.

* * * * *